(12) United States Patent
Miura

(10) Patent No.: US 12,354,999 B2
(45) Date of Patent: Jul. 8, 2025

(54) SEMICONDUCTOR DEVICE AND METHOD OF MANUFACTURING THE SAME

(71) Applicant: Kioxia Corporation, Tokyo (JP)

(72) Inventor: Masayuki Miura, Tokyo (JP)

(73) Assignee: Kioxia Corporation, Tokyo (JP)

( * ) Notice: Subject to any disclaimer, the term of this patent is extended or adjusted under 35 U.S.C. 154(b) by 451 days.

(21) Appl. No.: 17/940,939

(22) Filed: Sep. 8, 2022

(65) Prior Publication Data

US 2023/0307416 A1 Sep. 28, 2023

(30) Foreign Application Priority Data

Mar. 23, 2022 (JP) ................................. 2022-047236

(51) Int. Cl.
*H01L 25/065* (2023.01)
*H01L 25/00* (2006.01)
*H01L 25/18* (2023.01)

(52) U.S. Cl.
CPC .......... *H01L 25/0652* (2013.01); *H01L 25/18* (2013.01); *H01L 25/50* (2013.01); *H01L 2225/06506* (2013.01); *H01L 2225/06562* (2013.01); *H01L 2225/06586* (2013.01)

(58) Field of Classification Search
CPC ...... H01L 25/0652; H01L 25/18; H01L 25/50
See application file for complete search history.

(56) References Cited

U.S. PATENT DOCUMENTS

| | | | |
|---|---|---|---|
| 6,376,904 B1 | 4/2002 | Khalili et al. | |
| 7,667,333 B2 | 2/2010 | Singleton et al. | |
| 7,911,064 B2 | 3/2011 | Komatsu et al. | |
| 7,951,702 B2 | 5/2011 | Wood et al. | |
| 9,640,513 B2 | 5/2017 | Lee et al. | |
| 10,115,704 B2* | 10/2018 | Sagiya | H01L 25/50 |
| 2009/0218670 A1* | 9/2009 | Yamamoto | H01L 24/49 |
| | | | 257/690 |
| 2009/0230546 A1 | 9/2009 | Komatsu et al. | |
| 2013/0037941 A1* | 2/2013 | Fujiwara | H01L 24/97 |
| | | | 257/737 |
| 2020/0075543 A1 | 3/2020 | Kosaka | |
| 2020/0212005 A1 | 7/2020 | Fang et al. | |

(Continued)

FOREIGN PATENT DOCUMENTS

| | | | |
|---|---|---|---|
| JP | 2002033443 A | 1/2002 | |
| JP | 2020035957 A | 3/2020 | |

(Continued)

*Primary Examiner* — Thao P Le
(74) *Attorney, Agent, or Firm* — Holtz, Holtz & Volek PC

(57) ABSTRACT

A semiconductor device includes: a wiring substrate in which a wiring layer is provided; a first semiconductor chip that is provided above the wiring substrate and on a surface of which a first pad is formed, the surface being on a side closer to the wiring substrate; a second semiconductor chip that is provided on the first semiconductor chip through a first resin layer and on a surface of which a second pad is formed, the surface being on a side opposite the wiring substrate; a third semiconductor chip that is provided on the second semiconductor chip through a second resin layer and on a surface of which a third pad is formed, the surface being on the side closer to the wiring substrate; and a first wire connecting the first pad and the third pad; and a second wire connecting the second pad and the wiring substrate.

12 Claims, 20 Drawing Sheets

(56) References Cited

U.S. PATENT DOCUMENTS

| | | |
|---|---|---|
| 2020/0350293 A1 | 11/2020 | Yoo et al. |
| 2021/0375848 A1 | 12/2021 | Zhou et al. |
| 2022/0293138 A1 | 9/2022 | Kawasaki et al. |
| 2023/0089223 A1 | 3/2023 | Homma et al. |
| 2024/0038727 A1* | 2/2024 | Kim .................. H01L 24/32 |
| 2024/0113074 A1* | 4/2024 | An .................... H01L 24/73 |
| 2024/0284684 A1* | 8/2024 | Watanabe ........... H01L 25/50 |
| 2025/0046747 A1* | 2/2025 | Kweon ................ H01L 24/33 |
| 2025/0070087 A1* | 2/2025 | Oh .................... H01L 24/29 |
| 2025/0070088 A1* | 2/2025 | Hong ................. H01L 24/05 |

FOREIGN PATENT DOCUMENTS

| | | |
|---|---|---|
| JP | 2023045852 A | 4/2023 |
| TW | 202011546 A | 3/2020 |
| WO | 2006095602 A1 | 9/2006 |

\* cited by examiner

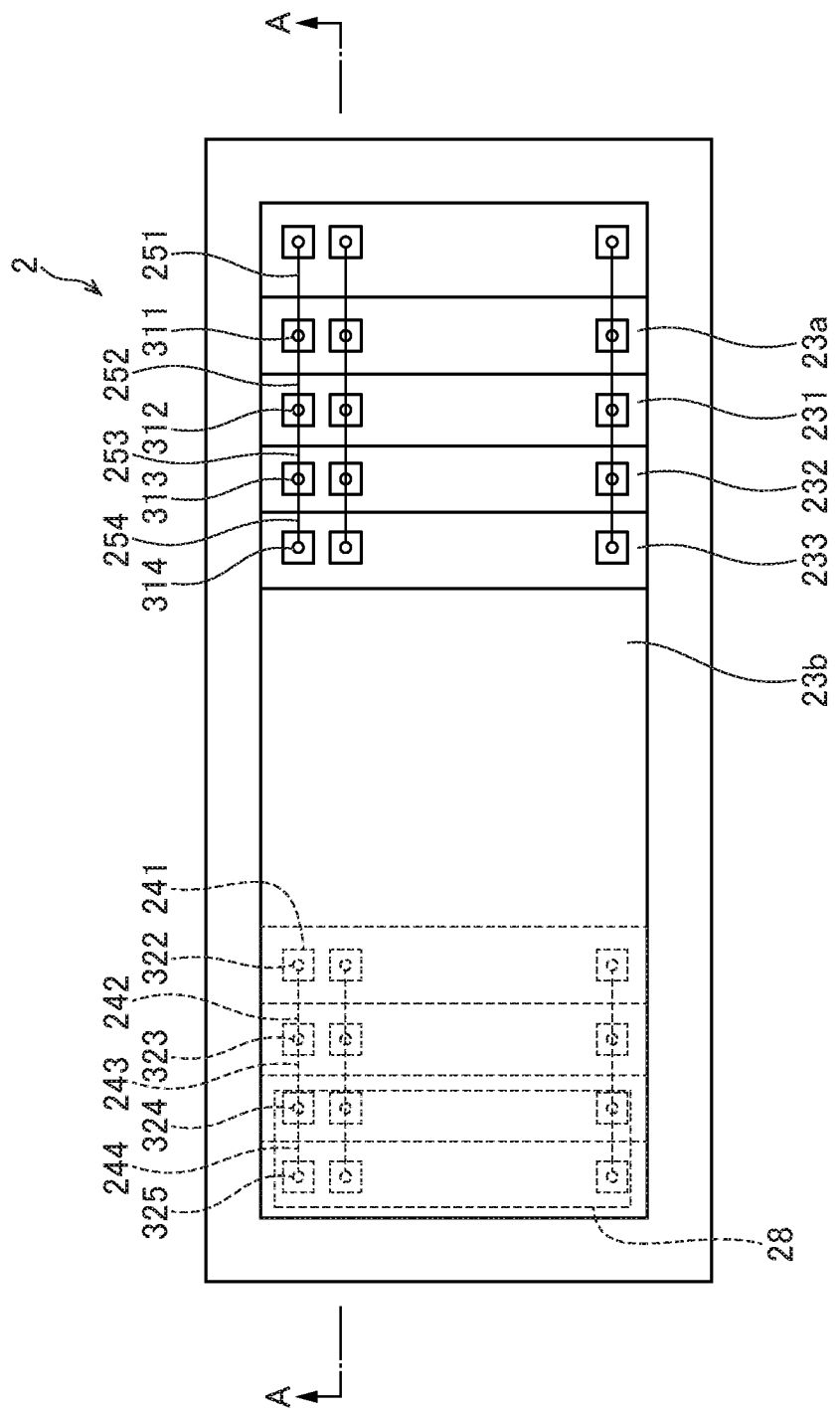

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2022-047236, filed on Mar. 23, 2022, the entire contents of which are incorporated herein by reference.

BACKGROUND OF THE INVENTION

Field of the Invention

The present embodiments relate to a semiconductor device and a method of manufacturing the same.

Description of the Related Art

In a configuration of a semiconductor device, a plurality of chips are stacked and terminals extend in the stacking direction from the chips. It is desired that the plurality of chips are appropriately disposed in the semiconductor device.

BRIEF DESCRIPTION OF THE DRAWINGS

FIG. 1B is a plan view illustrating the semiconductor device in the first embodiment;

DETAILED DESCRIPTION OF THE PREFERRED EMBODIMENTS

Figure 1A:
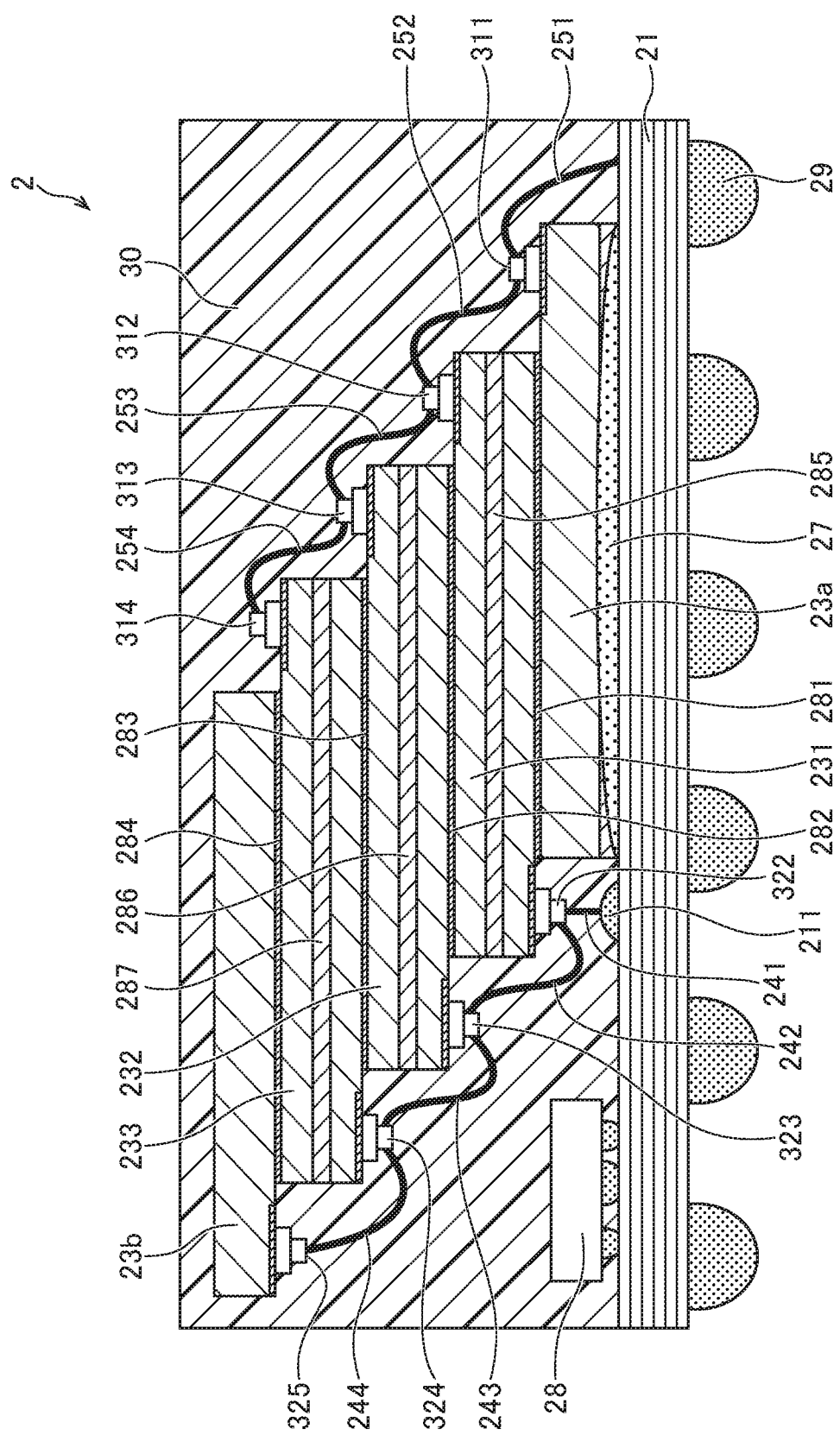
FIG. 1A is a cross-sectional view illustrating a semiconductor device in a first embodiment.

The present embodiments will be described below with reference to the accompanying drawings. To facilitate understanding of the description, identical constituent components in the drawings are denoted by the same reference sign when possible, and duplicate description thereof is omitted. The direction of gravity is defined as a downward direction, and the opposite direction is defined as an upward direction.

First Embodiment

A semiconductor device 2 in a first embodiment will be described below with reference to FIGS. 1A and 1B. FIG. 1A is a cross-sectional view of the semiconductor device 2, and FIG. 1B is a plan view of the semiconductor device 2. FIG. 1A illustrates an A-A section in FIG. 1B. The semiconductor device 2 includes a wiring substrate 21, first semiconductor chips 23*a*, 231, 232, 233, and 23*b*, connection wires 241, 242, 243, 244, 251, 252, 253, and 254, a second semiconductor chip 28, a metal ball 29, and a mold resin layer 30.

The wiring substrate 21 is a substrate inside which a non-illustrated wiring layer is provided. The first semiconductor chip 23*a* is provided on the wiring substrate 21 through a resin 27 as a bonding agent. The first semiconductor chip 23*a* is, for example, a memory chip of a NAND flash memory. The first semiconductor chip 231 is provided on the first semiconductor chip 23*a* through a resin 281. The first semiconductor chip 232 is provided on the first semiconductor chip 231 through a resin 282. The first semiconductor chip 233 is provided on the first semiconductor chip 232 through a resin 283. The first semiconductor chip 23*b* is provided on the first semiconductor chip 233 through a resin 284. The resins 281, 282, 283, and 284 may be each a die attach film (DAF) or a cured liquid bonding agent.

When the wiring substrate 21 is placed on the lower side, a pad 311 is provided on the upper side of the first semiconductor chip 23*a*. A pad 322 and a pad 312 are provided on the lower and upper sides, respectively, of the first semiconductor chip 231. A pad 323 and a pad 313 are provided on the lower and upper sides, respectively, of the first semiconductor chip 232. A pad 324 and a pad 314 are provided on the lower and upper sides, respectively, of the first semiconductor chip 233. A pad 325 is provided on the lower side of the first semiconductor chip 23*b*.

The first semiconductor chips 231, 232, and 233 are each a semiconductor chip obtained by bonding two semiconductor chips. The first semiconductor chips 23a and 23b are each one semiconductor chip and have thicknesses substantially equal to those of the first semiconductor chips 231, 232, and 233. Thus, although the five first semiconductor chips 23a, 231, 232, 233, and 23b are placed over, eight chips are stacked in effect since the first semiconductor chips 231, 232, and 233 are each two bonded semiconductor chips.

The first semiconductor chip 231 is one semiconductor chip obtained by bonding the back surfaces of a semiconductor chip in a face-down state relative to the wiring substrate 21 and a semiconductor chip in a face-up state relative to the wiring substrate 21. This is the same for the first semiconductor chips 232 and 233. The two semiconductor chips constituting the first semiconductor chip 231 are joined to each other through a die attach film (DAF) 285. The two semiconductor chips constituting the first semiconductor chip 232 are joined to each other through a die attach film 286. The two semiconductor chips constituting the first semiconductor chip 233 are joined to each other through a die attach film 287.

The first semiconductor chip 23a is mounted in a face-up state relative to the wiring substrate 21. The first semiconductor chip 23a is fixed to the wiring substrate 21 through a bonding agent 27. The first semiconductor chip 23a is electrically connected to the wiring substrate 21 through the connection wire 251. The semiconductor chip in a face-down state relative to the wiring substrate 21 in the first semiconductor chip 231 is electrically connected to the wiring substrate 21 through the connection wire 241. An end part of the connection wire 241 on the wiring substrate 21 side is connected to a bump 211 provided to the wiring substrate 21. The semiconductor chip in a face-up state relative to the wiring substrate 21 in the first semiconductor chip 231 is electrically connected to the first semiconductor chip 23a through the connection wire 252.

The semiconductor chip in a face-down state relative to the wiring substrate 21 in the first semiconductor chip 232 is electrically connected to the semiconductor chip in a face-down state relative to the wiring substrate 21 in the first semiconductor chip 231 through the connection wire 242. The semiconductor chip in a face-up state relative to the wiring substrate 21 in the first semiconductor chip 232 is electrically connected to the semiconductor chip in a face-up state relative to the wiring substrate 21 in the first semiconductor chip 231 through the connection wire 253.

The semiconductor chip in a face-down state relative to the wiring substrate 21 in the first semiconductor chip 233 is electrically connected to the semiconductor chip in a face-down state relative to the wiring substrate 21 in the first semiconductor chip 232 through the connection wire 243. The semiconductor chip in a face-up state relative to the wiring substrate 21 in the first semiconductor chip 233 is electrically connected to the semiconductor chip in a face-up state relative to the wiring substrate 21 in the first semiconductor chip 232 through the connection wire 254.

The first semiconductor chip 23b is mounted in a face-down state relative to the wiring substrate 21 on the first semiconductor chip 233. The first semiconductor chip 23b is electrically joined to the semiconductor chip in a face-down state relative to the wiring substrate 21 in the first semiconductor chip 233 through the connection wire 244.

The second semiconductor chip 28 is flip-chip mounted on the wiring substrate 21. The second semiconductor chip 28 is, for example, a semiconductor chip on which an optional LSI is mounted and has functions different from those of the first semiconductor chips 23a, 231, 232, 233, and 23b. The second semiconductor chip 28 is mounted on the wiring substrate 21 through a metal bump. The second semiconductor chip 28 may be a controller chip configured to control the first semiconductor chips.

The first semiconductor chips 23a, 231, 232, 233, and 23b are stacked in a shifted manner such that at least part of each first semiconductor chip faces the wiring substrate 21. A die attach film (DAF) is provided between the stacked first semiconductor chips 23a, 231, 232, 233, and 23b. The first semiconductor chips 23a, 231, 232, 233, and 23b are mounted in such a shifted manner that a first semiconductor chip mounted on the upper side is positioned closer to the second semiconductor chip 28. The first semiconductor chip 23a, which is disposed closest to the wiring substrate 21, is farthest from the second semiconductor chip 28. The first semiconductor chip 231 is disposed on the first semiconductor chip 23a, which is disposed closest to the wiring substrate 21, in such a shifted manner that the first semiconductor chip 231 is positioned closer to the second semiconductor chip 28. The first semiconductor chip 23b, which is disposed farthest from the wiring substrate 21, is closest to the second semiconductor chip 28.

As described above, the first semiconductor chips 231, 232, and 233 each have a configuration in which two semiconductor chips are bonded to each other. As illustrated in FIG. 1, a connection wire such as the connection wire 252 is connected to part of a semiconductor chip on a side in a first direction parallel to the wiring substrate 21 (the right side in the example illustrated in FIG. 1), the semiconductor chip being disposed in a face-up state relative to the wiring substrate 21 among the two semiconductor chips, and a connection wire such as the connection wire 242 is connected to part of a semiconductor chip on a side opposite the above-described first direction side (on the left side in the example illustrated in FIG. 1), the semiconductor chip being disposed in a face-down state relative to the wiring substrate 21.

The mold resin layer 30 is provided on the wiring substrate 21. The mold resin layer 30 covers the first semiconductor chips 23a, 231, 232, 233, and 23b, the connection wires 241, 242, 243, 244, 251, 252, 253, and 254, and the second semiconductor chip 28.

The metal ball 29 is provided on a surface opposite a surface of the wiring substrate 21 on which the first semiconductor chip 23a is mounted.

Figure 2:
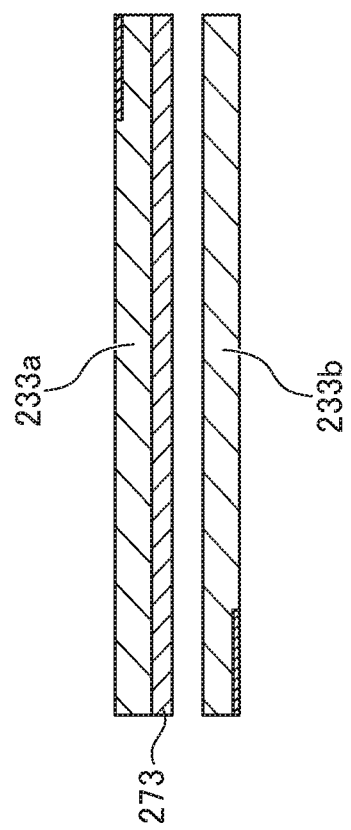
FIG. 2 is a cross-sectional view for description of a semiconductor device manufacturing method in the first embodiment.

Subsequently, a method of manufacturing the semiconductor device 2 will be described below with reference to FIGS. 2 to 9. As illustrated in FIG. 2, a semiconductor chip 233a and a semiconductor chip 233b are prepared. The first semiconductor chip 233 is formed by joining the back surfaces of the semiconductor chip 233a and the semiconductor chip 233b through a die attach film 273.

Figure 3:
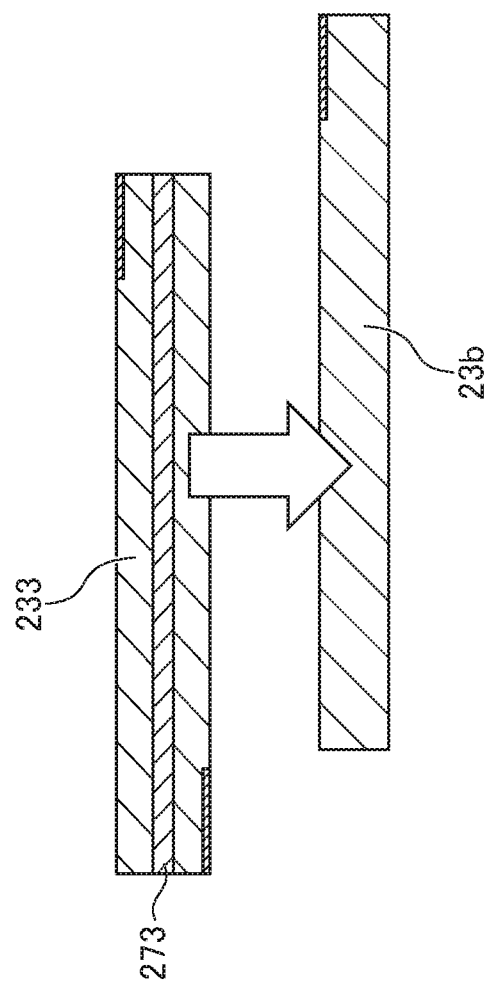
FIG. 3 is a cross-sectional view for description of the semiconductor device manufacturing method in the first embodiment.

Subsequently, as illustrated in FIG. 3, the first semiconductor chip 233 is stacked on the first semiconductor chip 23b through a bonding agent. The first semiconductor chip 233 is stacked on a surface at which the first semiconductor chip 23b faces the wiring substrate 21 when mounted. The above-described bonding agent becomes the resin 284 illustrated in FIG. 1A.

Figure 4:
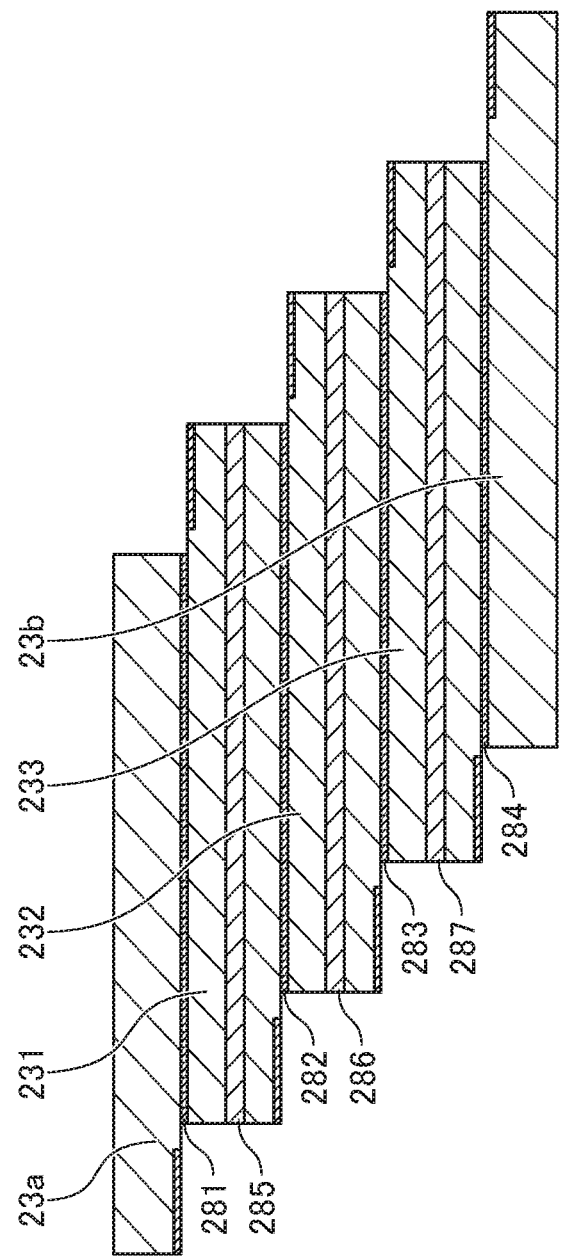
FIG. 4 is a cross-sectional view for description of the semiconductor device manufacturing method in the first embodiment.

Subsequently, as illustrated in FIG. 4, the first semiconductor chip 232 is stacked on the first semiconductor chip 233 through a bonding agent (the resin 283). The first semiconductor chip 232 is stacked on a surface at which the first semiconductor chip 233 faces the wiring substrate 21 when mounted. The first semiconductor chip 231 is stacked on the first semiconductor chip 232 through a bonding agent (the resin 282). The first semiconductor chip 231 is stacked on a surface at which the first semiconductor chip 232 faces the wiring substrate 21 when mounted. The first semiconductor chip 23a is stacked on the first semiconductor chip 231 through a bonding agent (the resin 281). The first semiconductor chip 23a is stacked on a surface at which the first semiconductor chip 231 faces the wiring substrate 21 when mounted.

Figure 5:
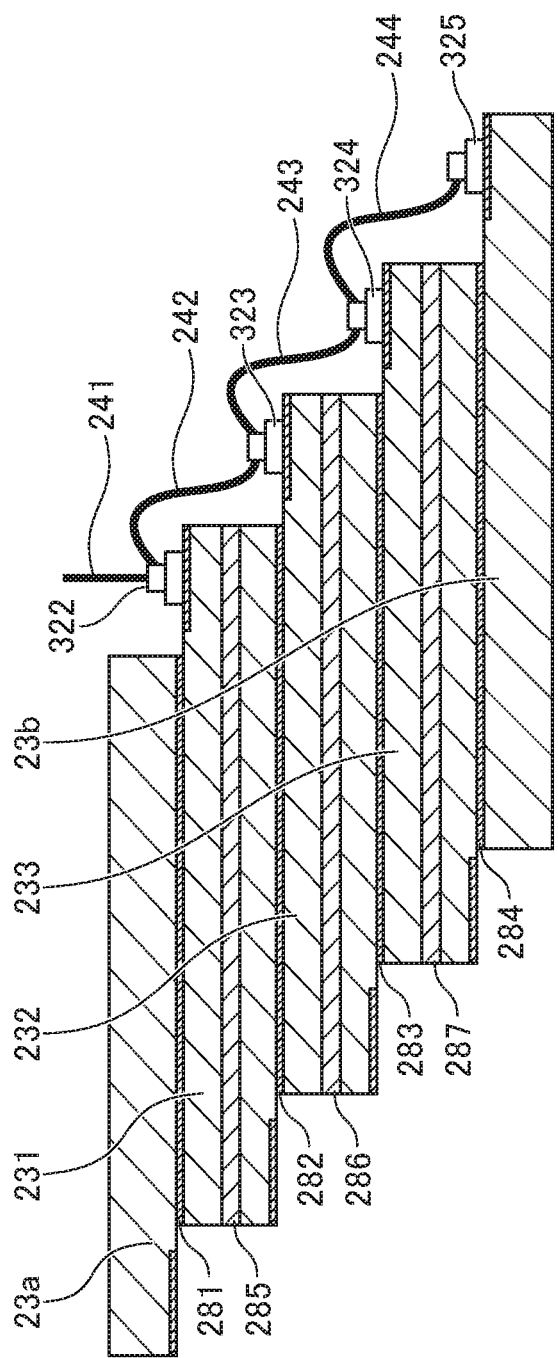
FIG. 5 is a cross-sectional view for description of the semiconductor device manufacturing method in the first embodiment.

Subsequently, as illustrated in FIG. 5, the semiconductor chips are electrically connected to each other. The pad 325 of the first semiconductor chip 23b and the pad 324 of the first semiconductor chip 233 are electrically connected to each other through the connection wire 244. The pad 324 of the first semiconductor chip 233 and the pad 323 of the first semiconductor chip 232 are electrically connected to each other through the connection wire 243. The pad 323 of the first semiconductor chip 232 and the pad 322 of the first semiconductor chip 231 are electrically connected to each other through the connection wire 242. The connection wire 241 is provided as a vertical wire on the pad 322 of the first semiconductor chip 231.

Figure 6:
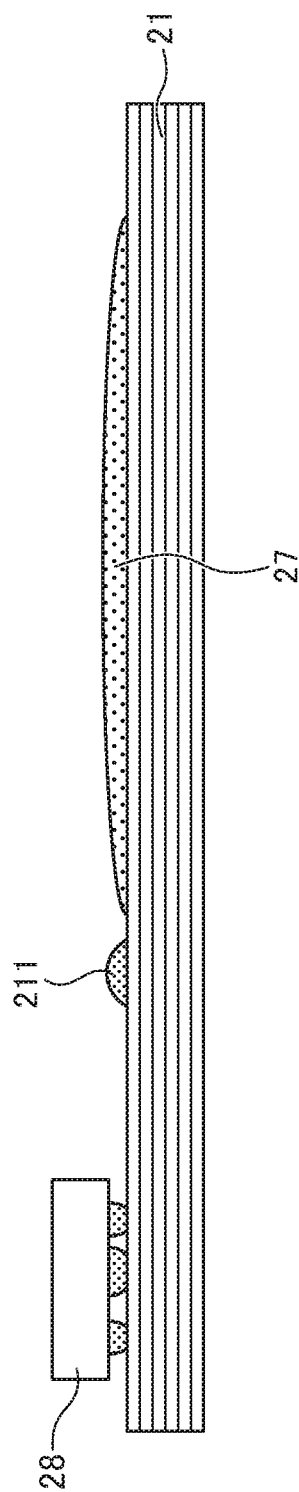
FIG. 6 is a cross-sectional view for description of the semiconductor device manufacturing method in the first embodiment.

Subsequently, as illustrated in FIG. 6, the wiring substrate 21 and the second semiconductor chip 28 are prepared. The second semiconductor chip 28 is flip-chip mounted on the wiring substrate 21. The bonding agent 27 is applied on the wiring substrate 21. The bump 211 is formed on the wiring substrate 21.

Figure 7:
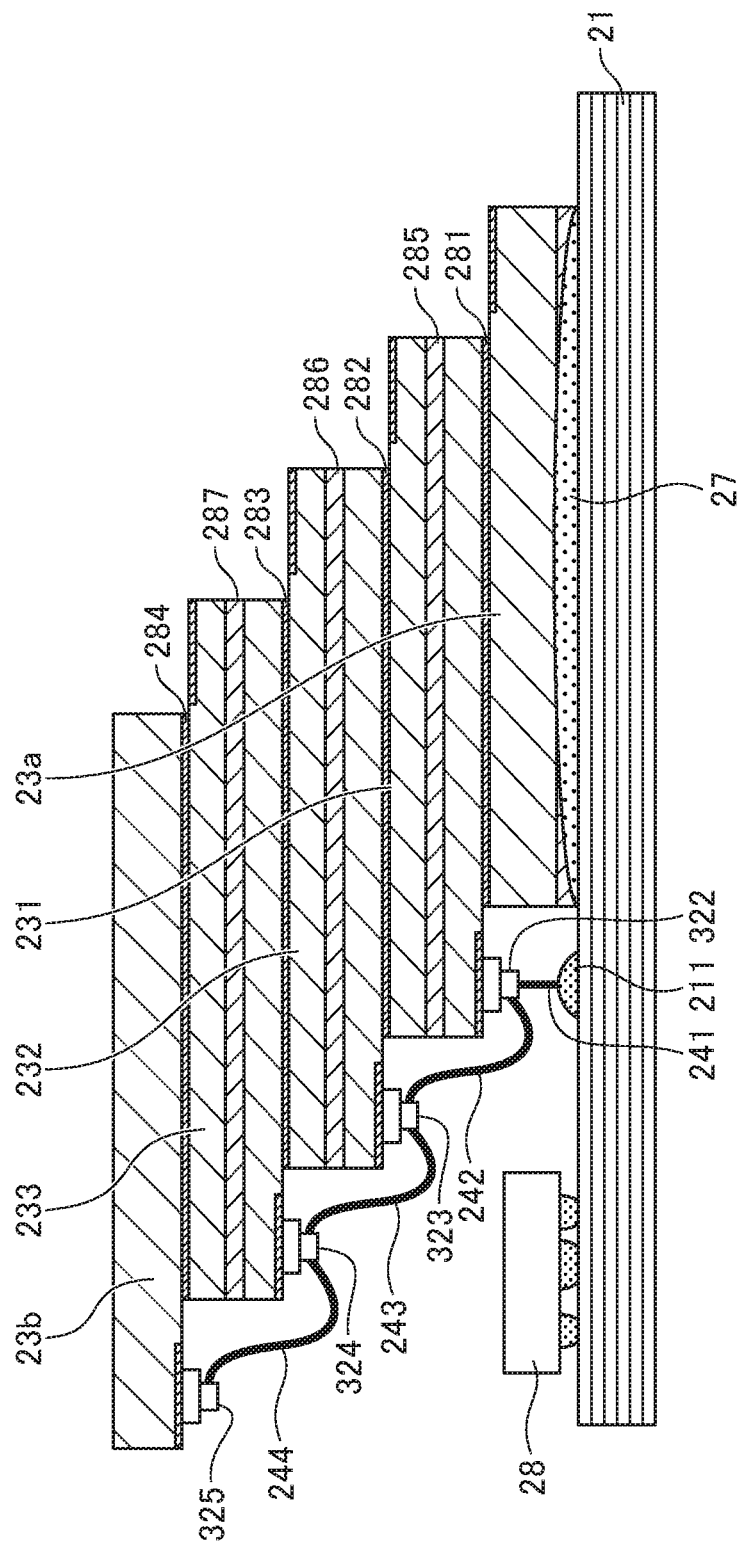
FIG. 7 is a cross-sectional view for description of the semiconductor device manufacturing method in the first embodiment.

Subsequently, as illustrated in FIG. 7, the stacked body prepared in FIG. 5 is mounted on the wiring substrate 21. The stacked body prepared in FIG. 5 is vertically inverted and disposed such that the first semiconductor chip 23a contacts the wiring substrate 21. The connection wire 241 is joined to the bump 211 of the wiring substrate 21.

Figure 8:
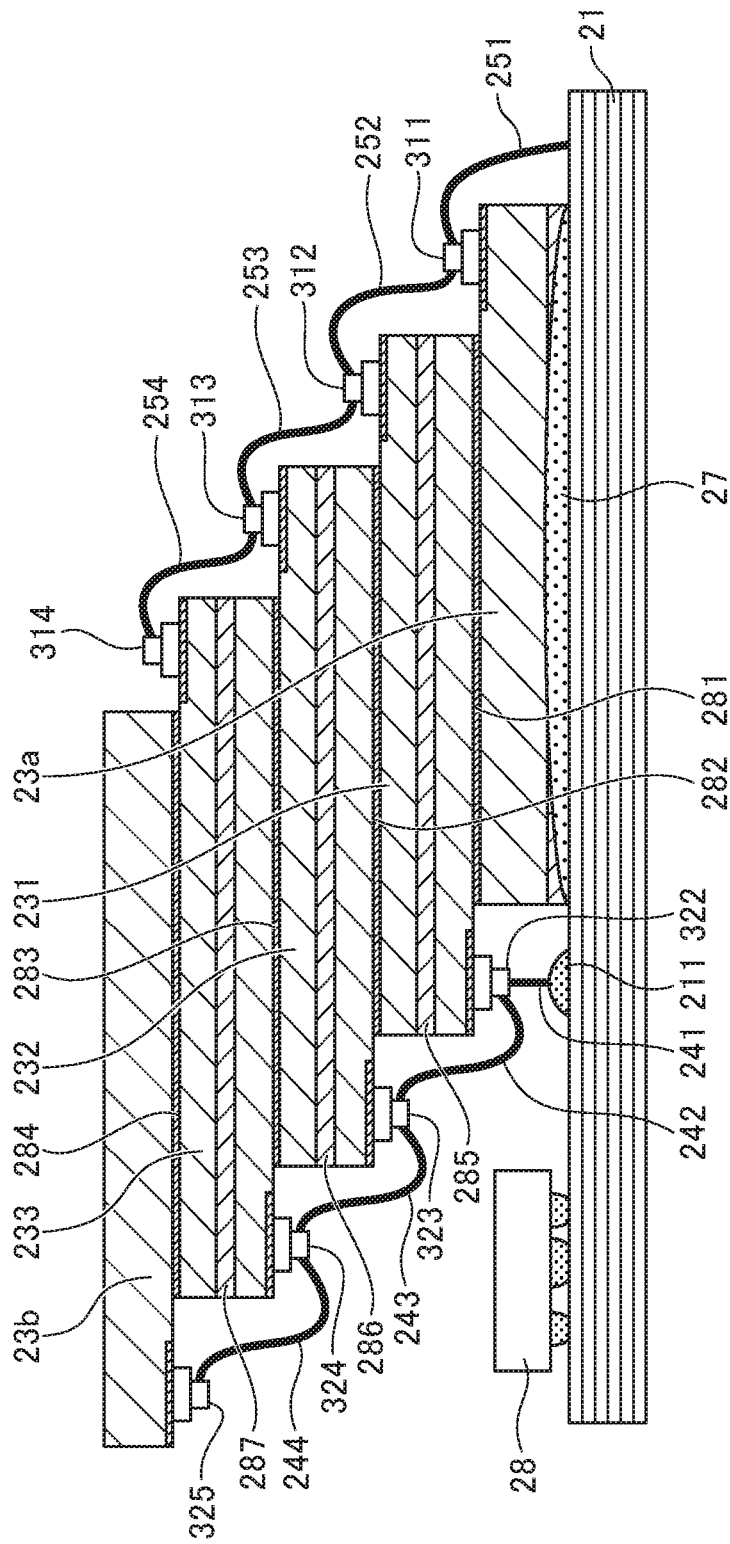
FIG. 8 is a cross-sectional view for description of the semiconductor device manufacturing method in the first embodiment.

Subsequently, as illustrated in FIG. 8, the semiconductor chips are electrically connected to each other. The pad 314 of the first semiconductor chip 233 and the pad 313 of the first semiconductor chip 232 are electrically connected to each other through the connection wire 254. The pad 313 of the first semiconductor chip 232 and the pad 312 of the first semiconductor chip 231 are electrically connected to each other through the connection wire 253. The pad 312 of the first semiconductor chip 231 and the pad 311 of the first semiconductor chip 23a are electrically connected to each other through the connection wire 252. The pad 311 of the first semiconductor chip 23a and the wiring substrate 21 are electrically connected to each other through the connection wire 251.

Figure 9:
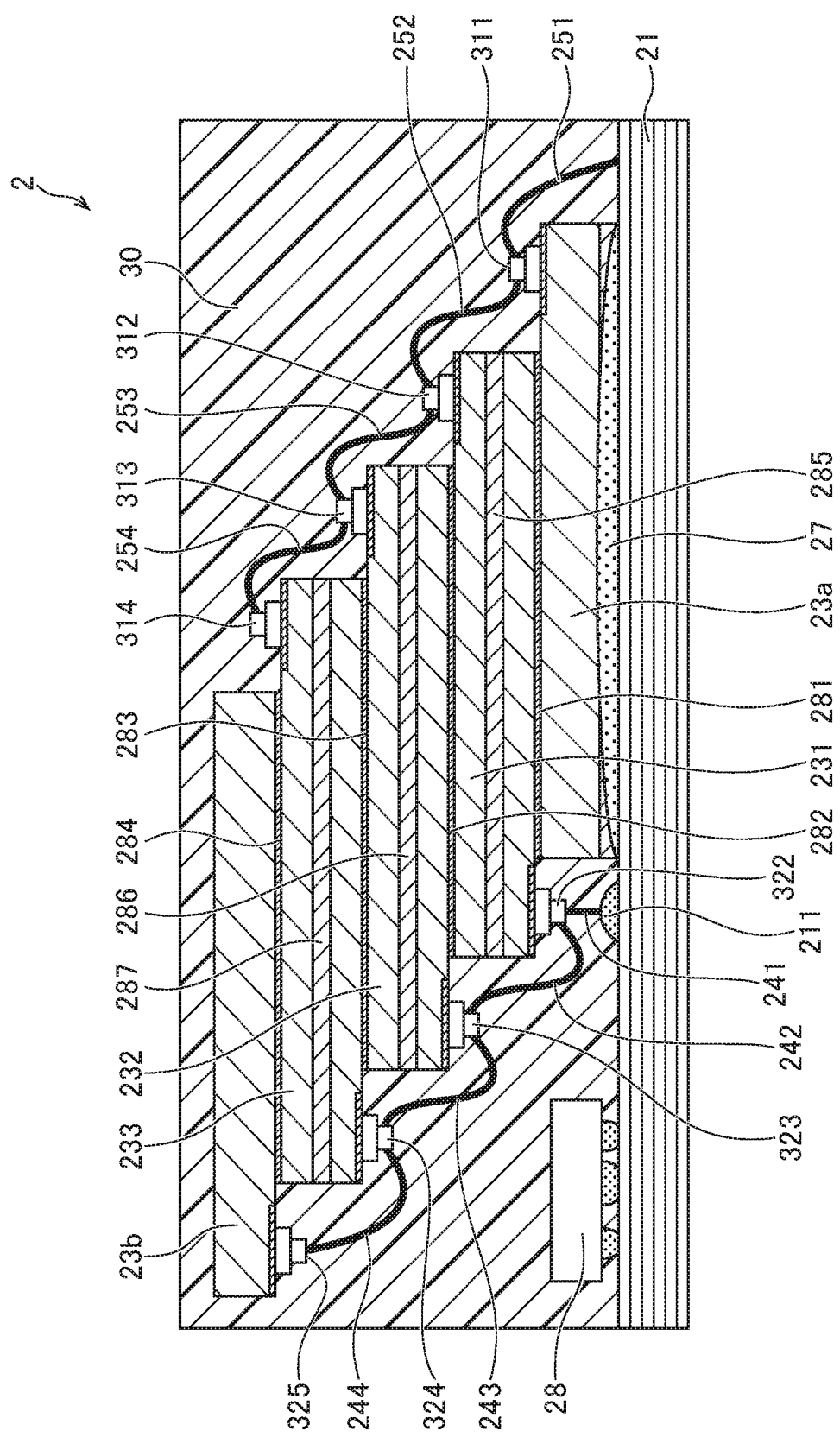
FIG. 9 is a cross-sectional view for description of the semiconductor device manufacturing method in the first embodiment.

Subsequently, as illustrated in FIG. 9, the mold resin layer 30 is formed to cover the first semiconductor chips 23a, 231, 232, 233, and 23b, the connection wires 241, 242, 243, 244, 251, 252, 253, and 254, and the second semiconductor chip 28.

The metal ball 29 is provided on the surface opposite the surface of the wiring substrate 21 on which the first semiconductor chip 23a is mounted, and accordingly, the semiconductor device 2 as illustrated in FIG. 1 is formed.

Second Embodiment

A spacer 22 is provided between the first semiconductor chip 23a, which is disposed closest to the wiring substrate 21, and the wiring substrate 21. A die attach film (DAF) is provided between the spacer 22 and the first semiconductor chip 23a. Although not illustrated, a bonding layer is provided between the wiring substrate 21 and the spacer 22.

Figure 10:
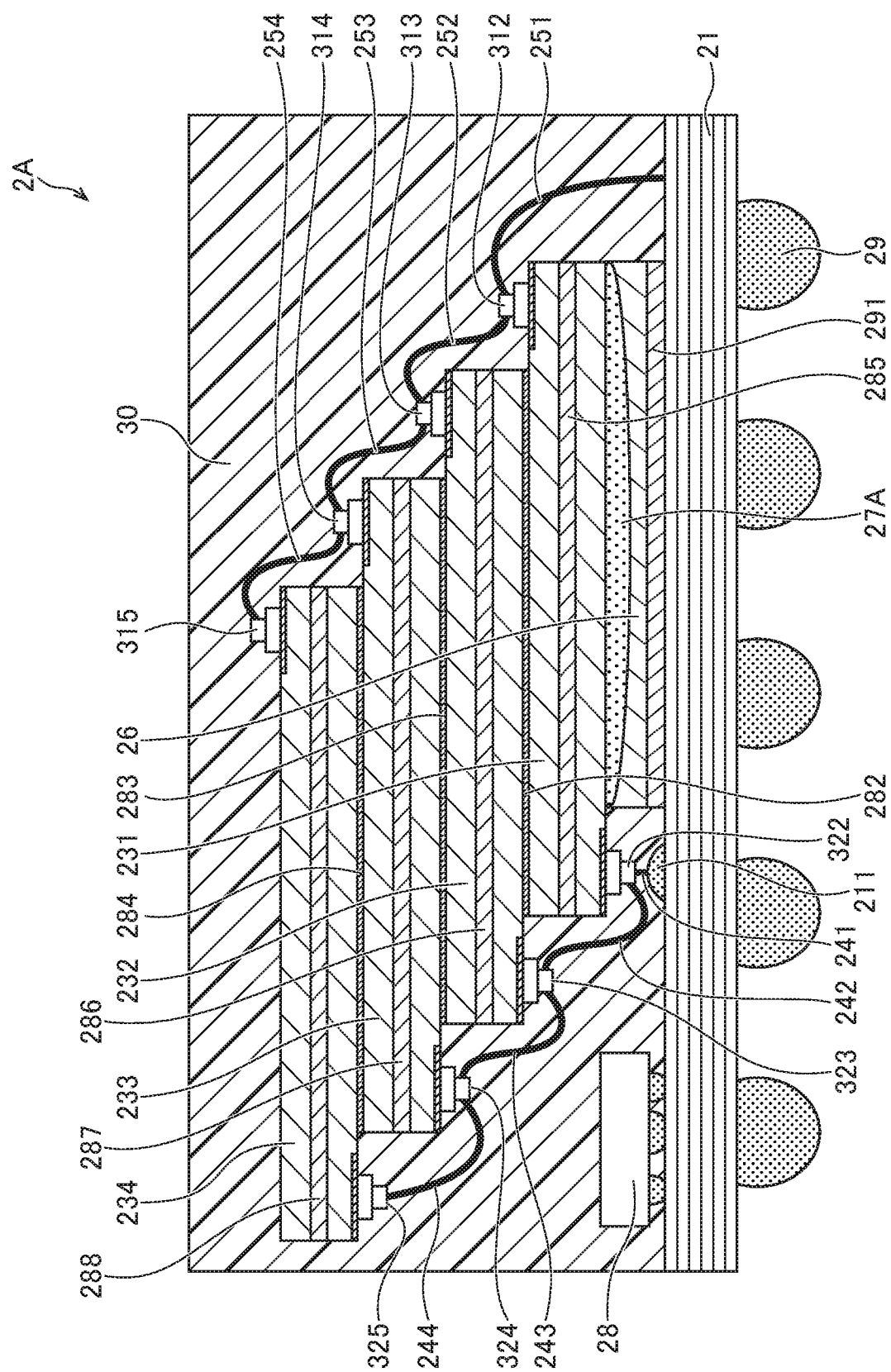
FIG. 10 is a cross-sectional view illustrating a semiconductor device in a second embodiment.

A semiconductor device 2A in a second embodiment will be described below with reference to FIG. 10. FIG. 10 is a cross-sectional view of the semiconductor device 2A. As illustrated in FIG. 10, the semiconductor device 2A includes a wiring substrate 21, first semiconductor chips 231, 232, 233, and 234, connection wires 241, 242, 243, 244, 251, 252, 253, and 254, a spacer 26, a second semiconductor chip 28, a metal ball 29, and a mold resin layer 30.

The spacer 26 is provided on the wiring substrate 21. A die attach film 291 is provided between the wiring substrate 21 and the spacer 26. The first semiconductor chip 231 is provided on the spacer 26 through a resin 27A. The first semiconductor chip 231 is, for example, a memory chip of a NAND flash memory. The first semiconductor chip 232 is provided on the first semiconductor chip 231 through a resin 282. The first semiconductor chip 233 is provided on the first semiconductor chip 232 through a resin 283. The first semiconductor chip 234 is provided on the first semiconductor chip 233 through a resin 284. The resins 291, 27A, 282, 283, and 284 may be each a die attach film (DAF) or a cured liquid bonding agent.

The first semiconductor chips 231, 232, 233, and 234 are each a semiconductor chip obtained by bonding two semiconductor chips. Thus, although the four first semiconductor chips 231, 232, 233, and 234 are placed over, eight chips are stacked in effect since the first semiconductor chips 231, 232, 233, and 234 are each two bonded semiconductor chips.

The first semiconductor chip 231 is one semiconductor chip obtained by bonding the back surfaces of a semiconductor chip in a face-down state relative to the wiring substrate 21 and a semiconductor chip in a face-up state relative to the wiring substrate 21. This is the same for the first semiconductor chips 232, 233, and 234. The two semiconductor chips constituting the first semiconductor chip 231 are joined to each other through a die attach film 285. The two semiconductor chips constituting the first semiconductor chip 232 are joined to each other through a die attach film 286. The two semiconductor chips constituting the first semiconductor chip 233 are joined to each other through the die attach film 287. The two semiconductor chips constituting the first semiconductor chip 234 are joined to each other through a die attach film 288.

The semiconductor chip in a face-down state relative to the wiring substrate 21 in the first semiconductor chip 231 is electrically connected to the wiring substrate 21 through the connection wire 241. The semiconductor chip in a face-up state relative to the wiring substrate 21 in the first semiconductor chip 231 is electrically connected to the wiring substrate 21 through the connection wire 251.

The semiconductor chip in a face-down state relative to the wiring substrate 21 in the first semiconductor chip 232 is electrically connected to the semiconductor chip in a face-down state relative to the wiring substrate 21 in the first semiconductor chip 231 through the connection wire 242. The semiconductor chip in a face-up state relative to the wiring substrate 21 in the first semiconductor chip 232 is electrically connected to the semiconductor chip in a face-up state relative to the wiring substrate 21 in the first semiconductor chip 231 through the connection wire 252.

The semiconductor chip in a face-down state relative to the wiring substrate 21 in the first semiconductor chip 233 is electrically connected to the semiconductor chip in a face-down state relative to the wiring substrate 21 in the first semiconductor chip 232 through the connection wire 243. The semiconductor chip in a face-up state relative to the wiring substrate 21 in the first semiconductor chip 233 is electrically connected to the semiconductor chip in a face-up state relative to the wiring substrate 21 in the first semiconductor chip 232 through the connection wire 253.

The semiconductor chip in a face-down state relative to the wiring substrate 21 in the first semiconductor chip 234 is electrically connected to the semiconductor chip in a face-down state relative to the wiring substrate 21 in the first semiconductor chip 233 through the connection wire 244. The semiconductor chip in a face-up state relative to the wiring substrate 21 in the first semiconductor chip 234 is electrically connected to the semiconductor chip in a face-up state relative to the wiring substrate 21 in the first semiconductor chip 233 through the connection wire 254.

The second semiconductor chip 28 is flip-chip mounted on the wiring substrate 21. The second semiconductor chip 28 is, for example, a semiconductor chip on which an optional LSI is mounted. The second semiconductor chip 28 is mounted on the wiring substrate 21 through a metal bump.

The first semiconductor chips 231, 232, 233, and 234 are stacked in such a shifted manner that at least part of each first semiconductor chip faces the wiring substrate 21. A die attach film (DAF) is provided between the stacked first semiconductor chips 231, 232, 233, and 234. The first semiconductor chips 231, 232, 233, and 234 are mounted in such a shifted manner that a first semiconductor chip mounted on the upper side is positioned closer to the second semiconductor chip 28. The first semiconductor chip 231, which is disposed closest to the wiring substrate 21, is farthest from the second semiconductor chip 28. The first semiconductor chip 232 is disposed on the first semiconductor chip 231, which is disposed closest to the wiring substrate 21, in such a shifted manner that the first semiconductor chip 232 is positioned closer to the second semiconductor chip 28. The first semiconductor chip 234, which is disposed farthest from the wiring substrate 21, is closest to the second semiconductor chip 28.

The mold resin layer 30 is provided on the wiring substrate 21. The mold resin layer 30 covers the first semiconductor chips 231, 232, 233, and 234, the connection wires 241, 242, 243, 244, 251, 252, 253, and 254, the spacer 26, and the second semiconductor chip 28.

The metal ball 29 is provided on a surface opposite a surface of the wiring substrate 21 on which the first semiconductor chip 231 is mounted.

Figure 11:
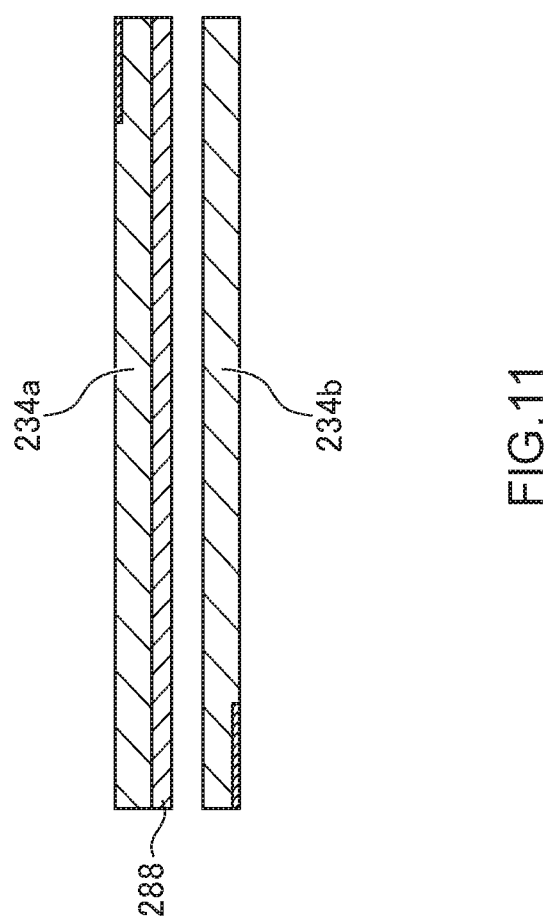
FIG. 11 is a cross-sectional view for description of a semiconductor device manufacturing method in the second embodiment.

Subsequently, a method of manufacturing the semiconductor device 2A will be described below with reference to FIGS. 11 to 19. As illustrated in FIG. 11, a semiconductor chip 234a and a semiconductor chip 234b are prepared. The first semiconductor chip 234 is formed by joining the back surfaces of the semiconductor chip 234a and the semiconductor chip 234b through the die attach film 288.

Figure 12:
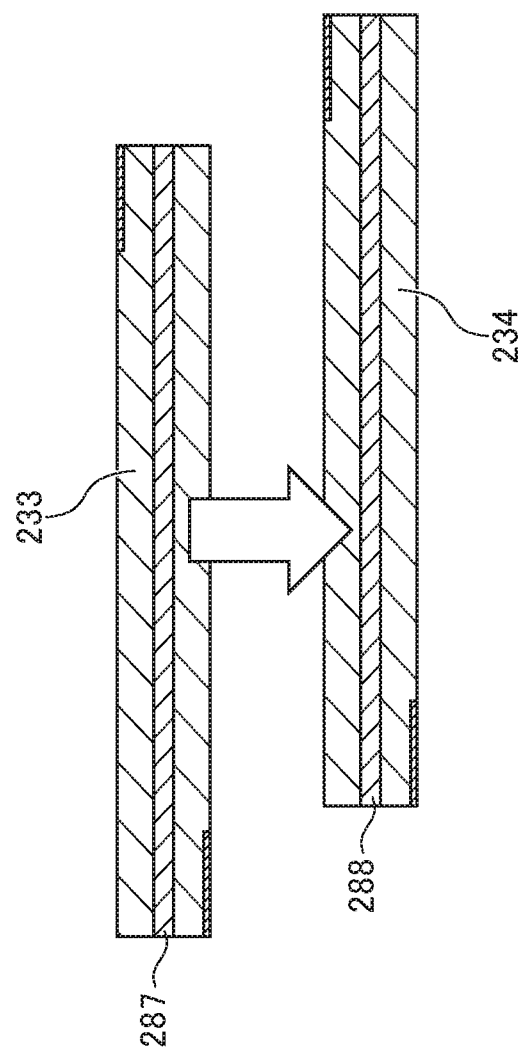
FIG. 12 is a cross-sectional view for description of the semiconductor device manufacturing method in the second embodiment.

Subsequently, as illustrated in FIG. 12, the first semiconductor chip 233 is stacked on the first semiconductor chip 234 through a bonding agent. The first semiconductor chip 233 is stacked on a surface at which the first semiconductor chip 234 faces the wiring substrate 21 when mounted. The above-described bonding agent becomes the resin 284 illustrated in FIG. 10.

Figure 13:
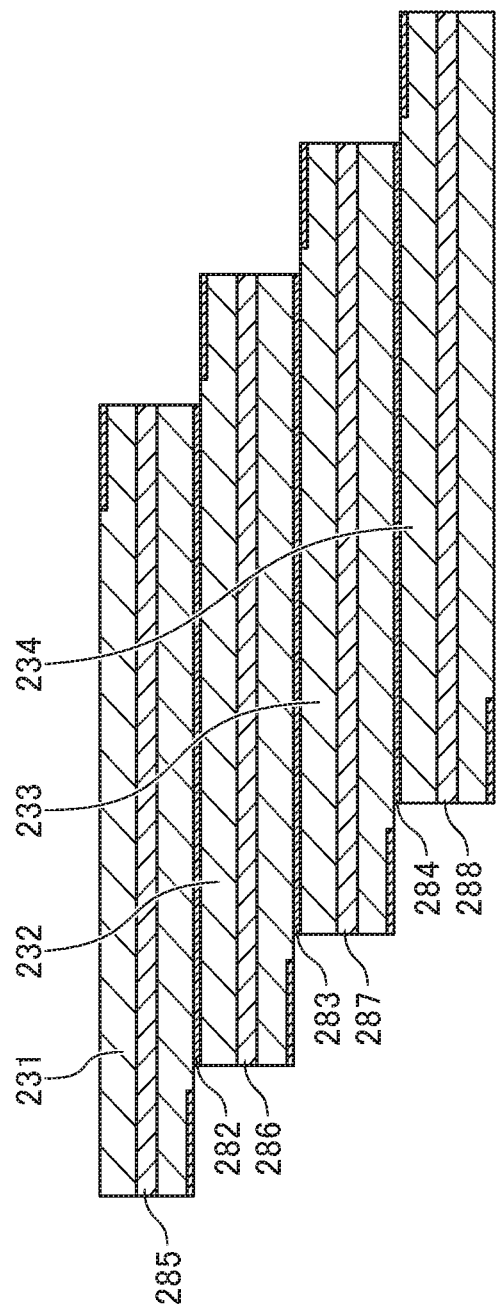
FIG. 13 is a cross-sectional view for description of the semiconductor device manufacturing method in the second embodiment.

Subsequently, as illustrated in FIG. 13, the first semiconductor chip 232 is stacked on the first semiconductor chip 233 through a bonding agent (the resin 283). The first semiconductor chip 232 is stacked on a surface at which the first semiconductor chip 233 faces the wiring substrate 21 when mounted. The first semiconductor chip 231 is stacked on the first semiconductor chip 232 through a bonding agent (the resin 282). The first semiconductor chip 231 is stacked on a surface at which the first semiconductor chip 232 faces the wiring substrate 21 when mounted.

Figure 14:
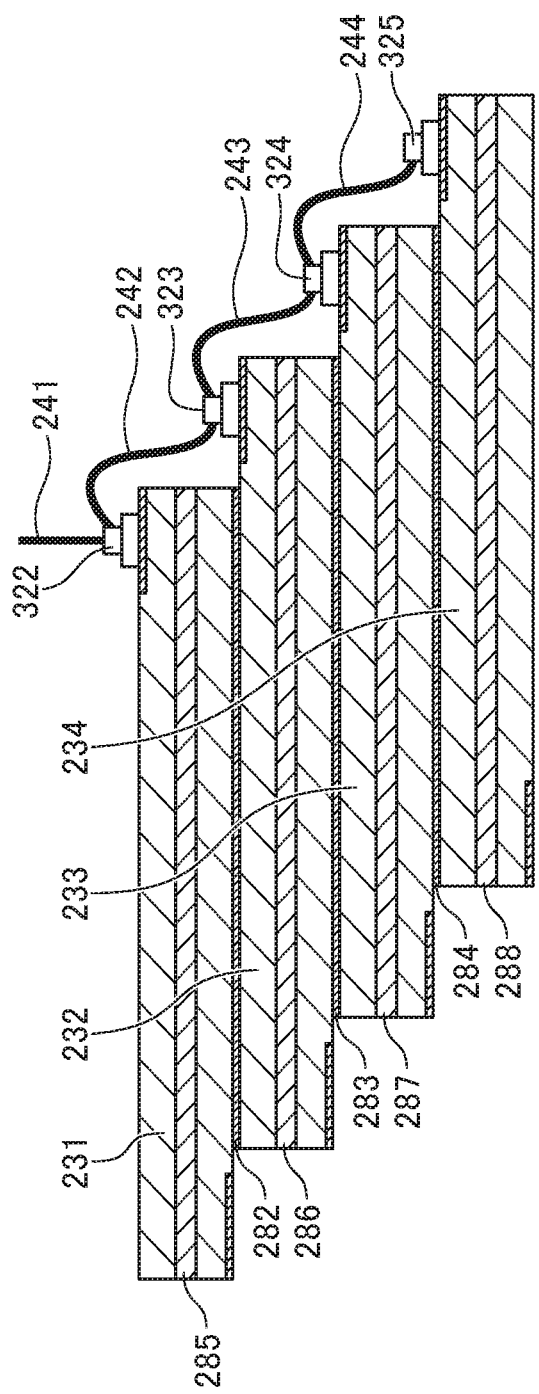
FIG. 14 is a cross-sectional view for description of the semiconductor device manufacturing method in the second embodiment.

Subsequently, as illustrated in FIG. 14, the semiconductor chips are electrically connected to each other. The pad 325 of the first semiconductor chip 234 and the pad 324 of the first semiconductor chip 233 are electrically connected to each other through the connection wire 244. The pad 324 of the first semiconductor chip 233 and the pad 323 of the first semiconductor chip 232 are electrically connected to each other through the connection wire 243. The pad 323 of the first semiconductor chip 232 and the pad 322 of the first semiconductor chip 231 are electrically connected to each other through the connection wire 242. The connection wire 241 is provided as a vertical wire on the pad 322 of the first semiconductor chip 231.

Figure 15:
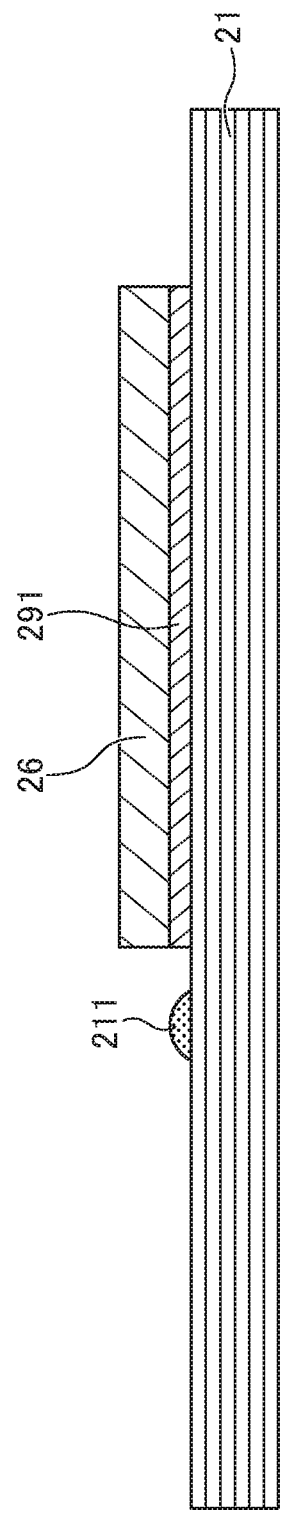
FIG. 15 is a cross-sectional view for description of the semiconductor device manufacturing method in the second embodiment.

Subsequently, as illustrated in FIG. 15, the wiring substrate 21 and the spacer 26 are prepared. The spacer 26 is joined on the wiring substrate 21 through the die attach film 291. The bump 211 is formed on the wiring substrate 21.

Figure 16:
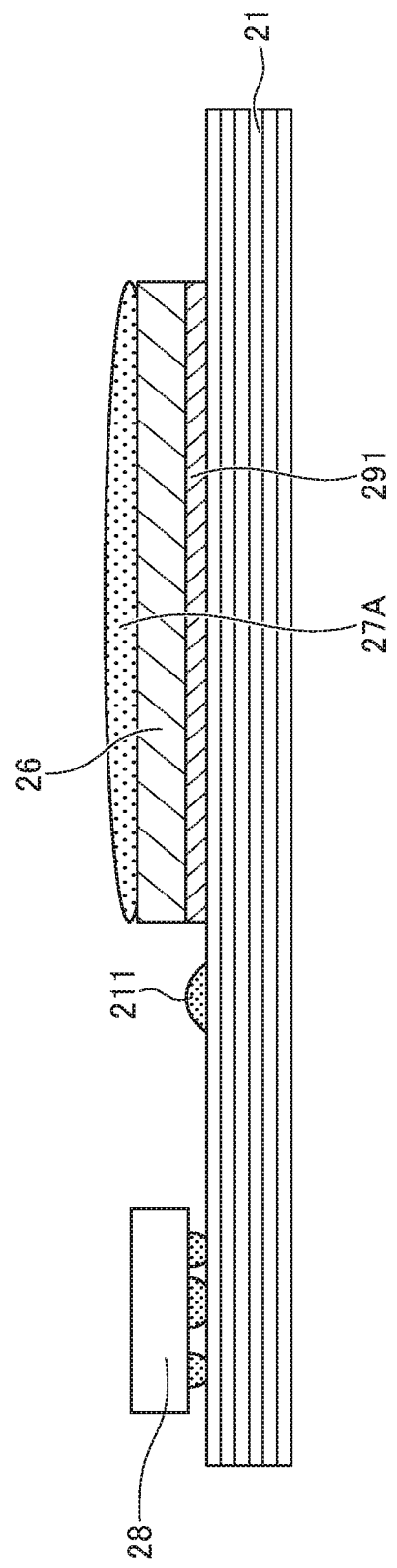
FIG. 16 is a cross-sectional view for description of the semiconductor device manufacturing method in the second embodiment.

Subsequently, as illustrated in FIG. 16, the second semiconductor chip 28 is flip-chip mounted on the wiring substrate 21. The resin 27A as a bonding agent is applied on the spacer 26.

Figure 17:
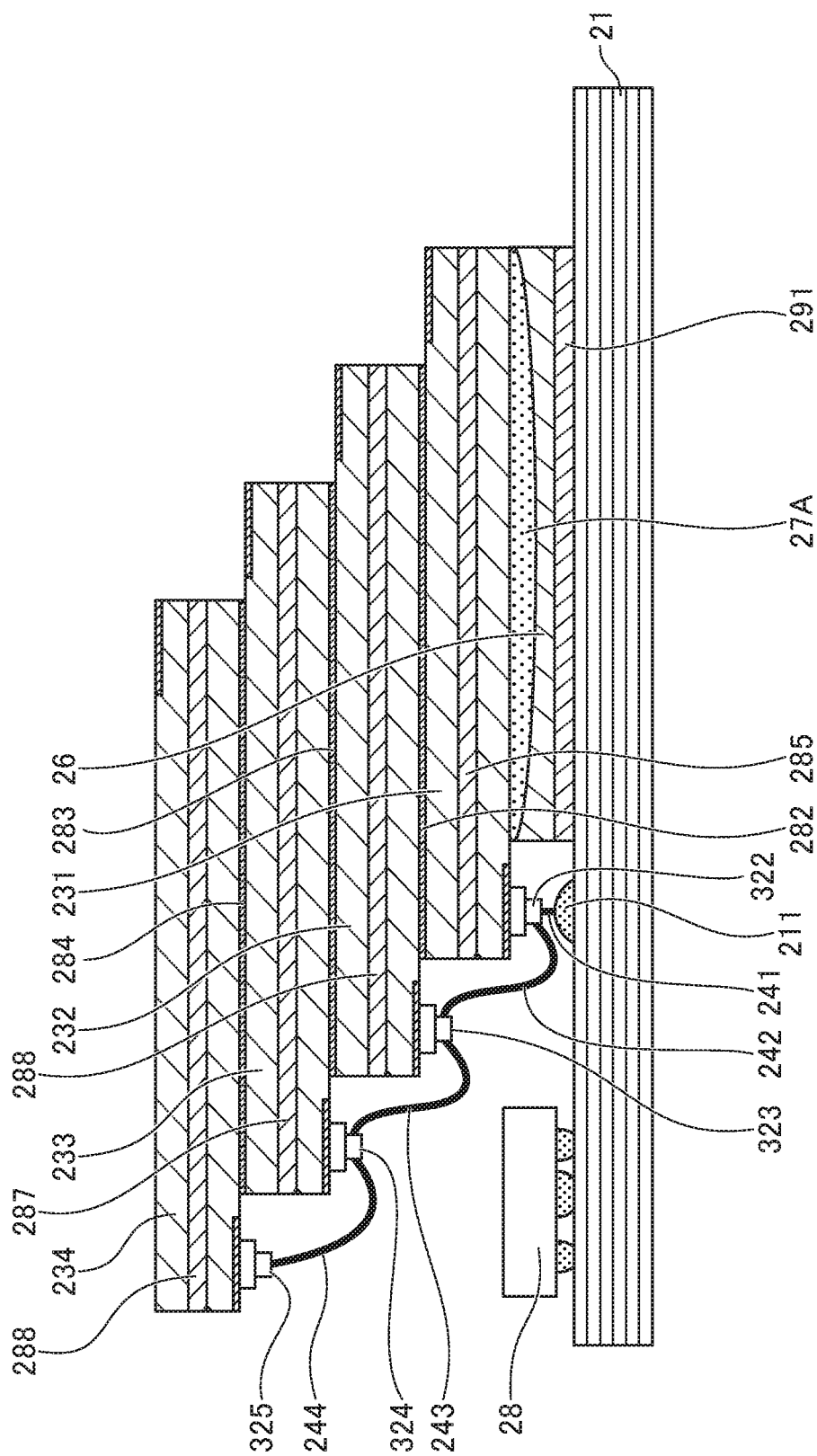
FIG. 17 is a cross-sectional view for description of the semiconductor device manufacturing method in the second embodiment.

Subsequently, as illustrated in FIG. 17, the stacked body prepared in FIG. 14 is mounted on the wiring substrate 21. The stacked body prepared in FIG. 14 is vertically inverted and disposed such that the first semiconductor chip 231 contacts the spacer 26. The connection wire 241 is joined to the bump 211 of the wiring substrate 21.

Figure 18:
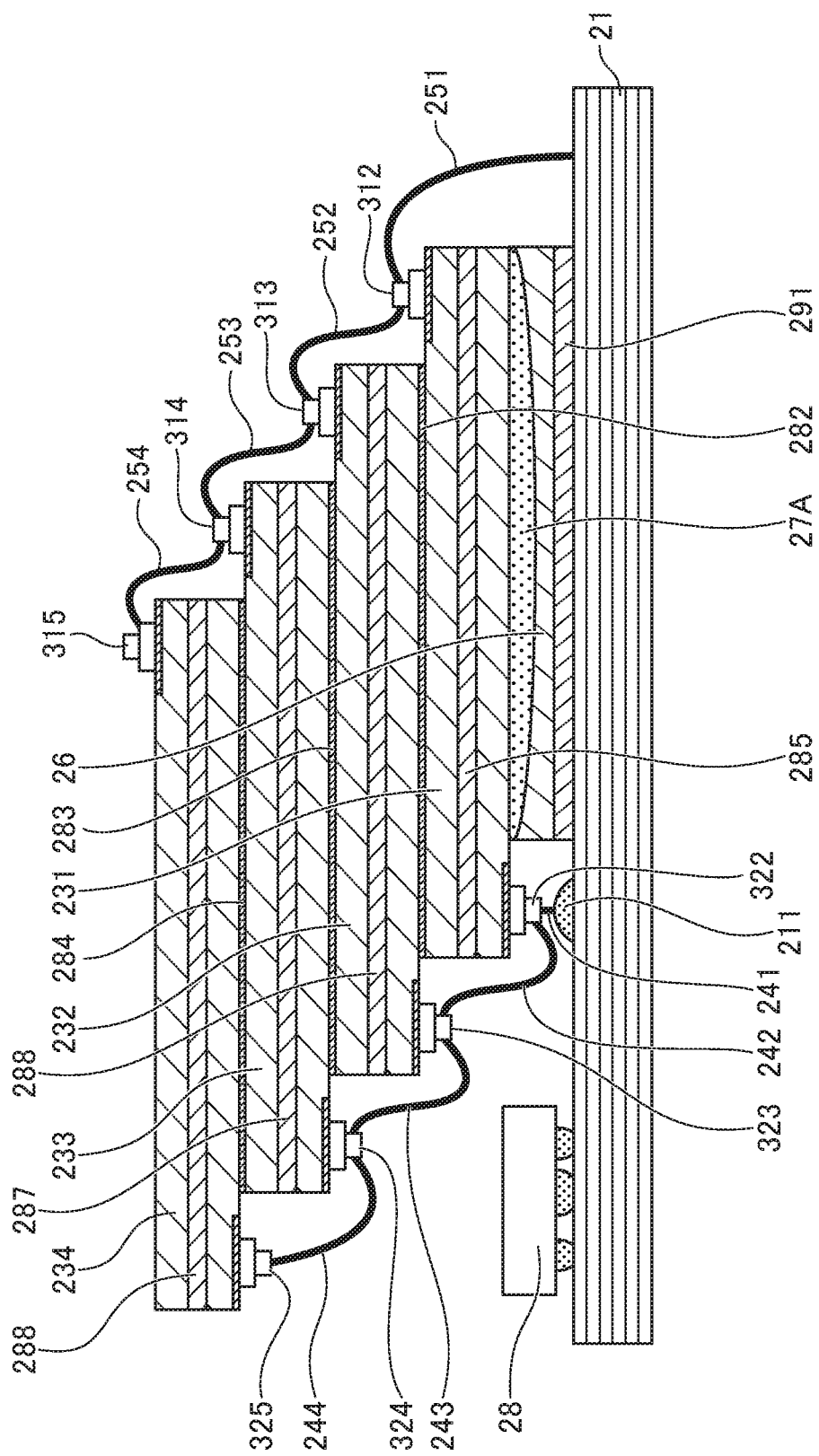
FIG. 18 is a cross-sectional view for description of the semiconductor device manufacturing method in the second embodiment.

Subsequently, as illustrated in FIG. 18, the semiconductor chips are electrically connected to each other. The pad 315 of the first semiconductor chip 234 and the pad 314 of the first semiconductor chip 233 are electrically connected to each other through the connection wire 254. The pad 314 of the first semiconductor chip 233 and the pad 313 of the first semiconductor chip 232 are electrically connected to each other through the connection wire 253. The pad 313 of the first semiconductor chip 232 and the pad 312 of the first semiconductor chip 231 are electrically connected to each other through the connection wire 252. The pad 312 of the first semiconductor chip 231 and the wiring substrate 21 are electrically connected to each other through the connection wire 251.

Figure 19:
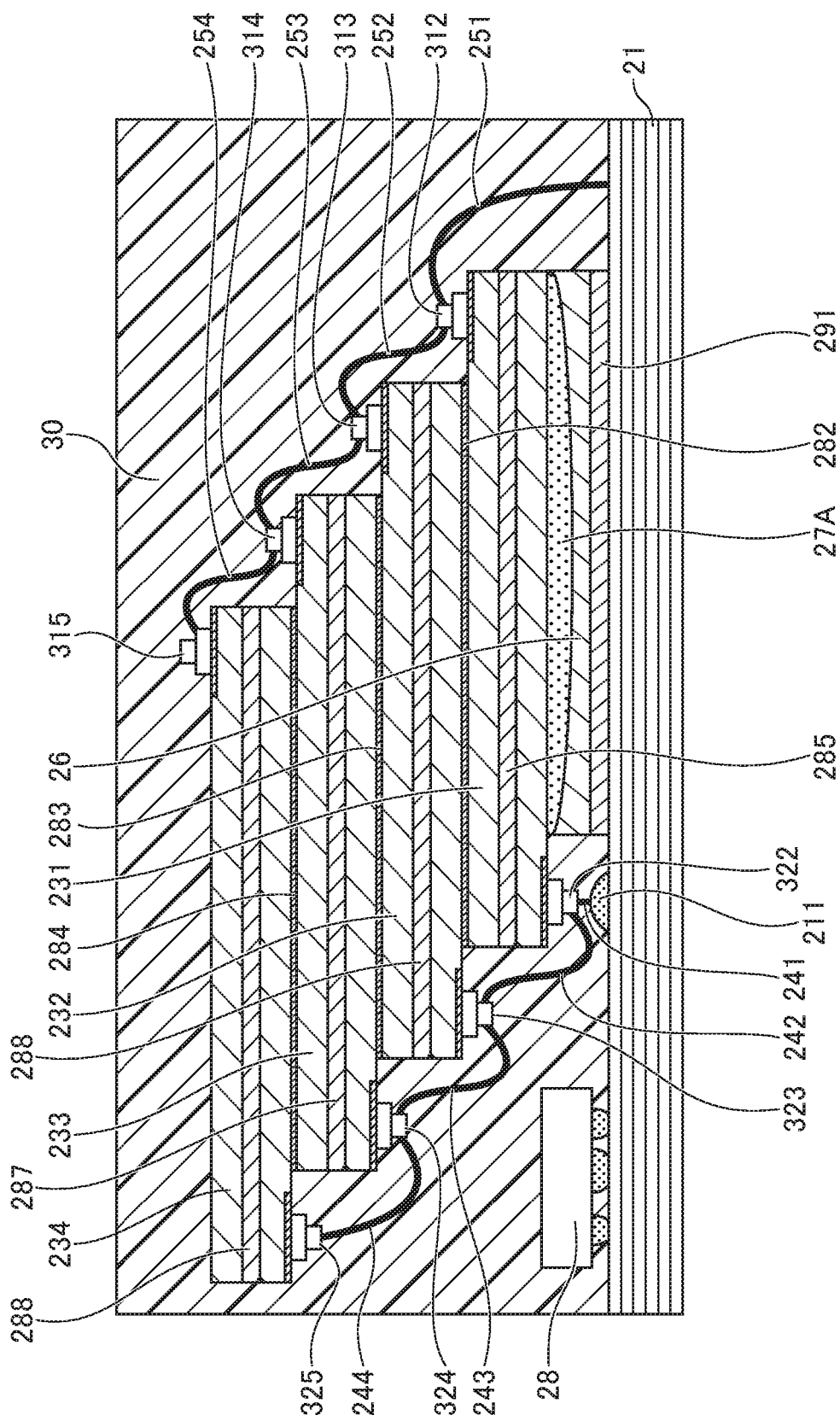
FIG. 19 is a cross-sectional view for description of the semiconductor device manufacturing method in the second embodiment.

Subsequently, as illustrated in FIG. 19, the mold resin layer 30 is formed to cover the first semiconductor chips 231, 232, 233, and 234, the connection wires 241, 242, 243, 244, 251, 252, 253, and 254, the spacer 26, and the second semiconductor chip 28.

The metal ball 29 is provided on the surface opposite the surface of the wiring substrate 21 on which the first semiconductor chip 231 is mounted, and accordingly, the semiconductor device 2A as illustrated in FIG. 10 is formed.

The present embodiments are described above with reference to specific examples. However, the present disclosure is not limited to these specific examples. Those obtained by changing designing of the specific examples as appropriate by the skilled person in the art are included in the scope of the present disclosure as long as they have features of the present disclosure. Each element included in each above-described specific example and, for example, the disposition, condition, and shape thereof are not limited to those exemplarily illustrated but may be changed as appropriate.

Combination of elements included in the above-described specific examples may be changed as appropriate without technological inconsistency.

What is claimed is:

1. A semiconductor device comprising:
a wiring substrate in which a wiring layer is provided;

a first semiconductor chip that is provided above the wiring substrate and on a surface of which a first pad is formed, the surface being on a side closer to the wiring substrate;

a second semiconductor chip that is provided on the first semiconductor chip through a first resin layer and on a surface of which a second pad is formed, the surface being on a side opposite the wiring substrate;

a third semiconductor chip that is provided on the second semiconductor chip through a second resin layer and on a surface of which a third pad is formed, the surface being on the side closer to the wiring substrate;

a first wire connecting the first pad and the third pad; and a second wire connecting the second pad and the wiring substrate.

2. The semiconductor device according to claim 1, further comprising a fourth semiconductor chip that is thicker than the first semiconductor chip and provided on the wiring substrate through a third resin layer and on a surface of which a fourth pad is formed, the surface being on the side opposite the wiring substrate, wherein the second wire is further connected to the fourth pad.

3. The semiconductor device according to claim 1, further comprising a sealing resin covering a surface of the third semiconductor chip on the side opposite the wiring substrate, wherein the third semiconductor chip is thicker than the second semiconductor chip.

4. The semiconductor device according to claim 1, further comprising a third wire having one end part provided at the first pad and having the other end part extending toward the wiring substrate.

5. The semiconductor device according to claim 1, wherein the first semiconductor chip is provided on the wiring substrate through a spacer.

6. The semiconductor device according to claim 1, wherein the first semiconductor chip, the second semiconductor chip, and the third semiconductor chip are memory chips, and a fifth semiconductor chip configured to control the first semiconductor chip, the second semiconductor chip, and the third semiconductor chip and at least partially overlapping the third semiconductor chip in a view in a direction orthogonal to a surface of the wiring substrate.

7. A semiconductor device manufacturing method comprising:

bonding, through a first bonding agent, a first semiconductor chip on which a first pad is formed and a second semiconductor chip on which a second pad is formed;

bonding, through a second bonding agent, a third semiconductor chip on which a third pad is formed and the second semiconductor chip;

connecting the first pad and the third pad through a first wire;

mounting the first semiconductor chip above a wiring substrate in which a wiring layer is provided such that the first pad faces the wiring substrate; and connecting the second pad and the wiring substrate through a second wire.

8. The semiconductor device manufacturing method according to claim 7, further comprising bonding, through a third bonding agent, the first semiconductor chip and a fourth semiconductor chip that is thicker than the first semiconductor chip and on which a fourth pad is formed, wherein the second pad and the fourth pad are connected to each other through the second wire.

9. The semiconductor device manufacturing method according to claim 7, wherein the third semiconductor chip is thicker than the second semiconductor chip, and a surface of the third semiconductor chip on the side opposite the wiring substrate is sealed with resin.

10. The semiconductor device manufacturing method according to claim 7, wherein a third wire having one end part provided on the first pad is formed before the first semiconductor chip is mounted above the wiring substrate, and the other end part of the third wire faces the wiring substrate side when the first semiconductor chip is mounted above the wiring substrate.

11. The semiconductor device manufacturing method according to claim 7, wherein a spacer is provided on the wiring substrate before the first semiconductor chip is mounted above the wiring substrate, and the first semiconductor chip is mounted on the spacer when the first semiconductor chip is mounted above the wiring substrate.

12. The semiconductor device manufacturing method according to claim 7, wherein the first semiconductor chip, the second semiconductor chip, and the third semiconductor chip are memory chips, a fifth semiconductor chip configured to control the first semiconductor chip, the second semiconductor chip, and the third semiconductor chip is provided on the wiring substrate, and the fifth semiconductor chip at least partially overlaps the third semiconductor chip in a view in a direction orthogonal to a surface of the wiring substrate when the first semiconductor chip is mounted above the wiring substrate.

* * * * *